United States Patent
Tzou et al.

(10) Patent No.: US 9,888,597 B2
(45) Date of Patent: Feb. 6, 2018

(54) ELASTIC COVER AND ELECTRONIC APPARATUS

(71) Applicants: Jyh-Chyang Tzou, Taipei (TW); Yuan-Ping Chu, Taipei (TW); Tsai-Wen Mao, Taipei (TW); Bar-Long Denq, Taipei (TW); Chun-Ping Li, Taipei (TW)

(72) Inventors: Jyh-Chyang Tzou, Taipei (TW); Yuan-Ping Chu, Taipei (TW); Tsai-Wen Mao, Taipei (TW); Bar-Long Denq, Taipei (TW); Chun-Ping Li, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 15/462,919

(22) Filed: Mar. 20, 2017

(65) Prior Publication Data

US 2017/0303416 A1 Oct. 19, 2017

(30) Foreign Application Priority Data

Apr. 13, 2016 (TW) .............................. 105111459 A

(51) Int. Cl.
*G06F 1/16* (2006.01)
*H05K 5/00* (2006.01)
(Continued)

(52) U.S. Cl.
CPC ....... *H05K 5/0239* (2013.01); *H01R 13/5213* (2013.01); *H05K 5/0278* (2013.01)

(58) Field of Classification Search
CPC .... G06F 1/1656; G06F 1/1675; G06F 1/1684; H05K 5/0239; H05K 5/0243; H05K 5/0286; H05K 5/0278; H05K 5/026
(Continued)

(56) References Cited

U.S. PATENT DOCUMENTS

| 4,997,103 A * | 3/1991 | Daly ..................... G06F 1/1626 |
| | | 206/1.5 |
| 5,574,625 A * | 11/1996 | Ohgami ................ G06F 1/1626 |
| | | 312/223.2 |
| 7,462,044 B1 * | 12/2008 | Regen ................ H01R 13/6641 |
| | | 439/131 |

(Continued)

FOREIGN PATENT DOCUMENTS

CN 202340017 7/2012

OTHER PUBLICATIONS

"Office Action of Taiwan Counterpart Application", dated Mar. 9, 2017, p. 1-p. 4, in which the listed reference was cited.

*Primary Examiner* — Anthony Haughton
(74) *Attorney, Agent, or Firm* — JCIPRNET

(57) ABSTRACT

An elastic cover, adapted to be disposed at a lateral side of an electronic device to cover at least a portion of a transmitting port, includes a body having two shielding sheets. Each shielding sheet includes a first portion close to the other shielding sheet and a second portion away from the other shielding sheet. A turn is formed between the first and the second portions so that a cross-section of the shielding sheet appears as a V shape. An opening of the V shape is adapted to face the lateral side. A slit is formed between the two shielding sheets and adapted to correspond to the transmitting port. A transmitting object is adapted to push the two first portions to enlarge the slit, so as to pass through the body and be plugged into the transmitting port. An electronic apparatus having the elastic cover is further provided.

20 Claims, 6 Drawing Sheets

(51) Int. Cl.
   *H05K 7/00* (2006.01)
   *H05K 5/02* (2006.01)
   *H01R 13/52* (2006.01)
(58) Field of Classification Search
   USPC .......................... 361/679.55, 679.4, 679.45
   See application file for complete search history.

(56) References Cited

U.S. PATENT DOCUMENTS

| | | | | |
|---|---|---|---|---|
| 7,495,895 B2* | 2/2009 | Carnevali | ............. | G06F 1/1626 |
| | | | | 361/679.26 |
| 2003/0227741 A1* | 12/2003 | Moore | .................. | G06F 1/1616 |
| | | | | 361/679.55 |
| 2004/0212966 A1* | 10/2004 | Fisher | ............. | G06K 19/07732 |
| | | | | 361/726 |
| 2007/0247793 A1* | 10/2007 | Carnevali | ............. | G06F 1/1626 |
| | | | | 361/679.1 |

* cited by examiner

ELASTIC COVER AND ELECTRONIC APPARATUS

CROSS-REFERENCE TO RELATED APPLICATION

This application claims the priority benefit of Taiwan application serial no. 105111459, filed on Apr. 13, 2016. The entirety of the above-mentioned patent application is hereby incorporated by reference herein and made a part of this specification.

BACKGROUND OF THE INVENTION

1. Field of the Invention

The invention generally relates to an elastic cover and an electronic apparatus having the elastic cover, and more particularly, to an elastic cover having both dustproof function and aesthetics and an electronic apparatus adopting the aforesaid elastic cover.

2. Description of Related Art

With advancement of technology, computer has become one of the necessities in daily life of modern human. Notebook computers have an advantage in portability, more and more people begin to use the notebook computers, and many associated application products are connected to the notebook computers through using various interfaces, such as universal serial bus interfaces (USB interfaces) or IEEE1394 interfaces. For instance, external peripheral devices connected through using the USB interfaces or the IEEE1394 interfaces include easy to carry portable hard drives, typical digital cameras, personal digital assistants (PDAs) or so forth.

For a conventional notebook computer, two sides thereof are generally being disposed with transmitting ports, and the transmitting ports due to having different sizes or heights are relatively difficult to be all centred and aligned, thereby resulting in a less aesthetic appearance. In addition, the exposed transmitting ports also have a risk of dust or liquid intrusion.

SUMMARY OF THE INVENTION

The invention is directed to an elastic cover adapted to cover a transmitting port of an electronic device so as to maintain an integrity of appearance and can lower a chance for dust or liquid to enter the transmitting port.

The invention is directed to an electronic apparatus having the aforesaid elastic cover.

An elastic cover of the invention is adapted to be disposed at a lateral side of an electronic device to cover at least a portion of a transmitting port of the electronic device. The elastic cover includes a body, and the body includes two shielding sheets adjacent to each other, wherein each of the shielding sheets includes a first portion close to the other shielding sheet and a second portion away from the other shielding sheet, a turn is formed between the first portion and the second portion so that a cross-section of the shielding sheet appears as a V shape, an opening of the V shape is adapted to face the lateral side of the electronic device, a slit is formed between the two shielding sheets, and the slit is adapted to be positioned corresponding to the transmitting port, wherein a transmitting object is adapted to push the two first portions of the two shielding sheets to enlarge the slit, so as to pass through the body and be plugged into the transmitting port.

An electronic apparatus of the invention includes an electronic device and an elastic cover. The electronic device includes a lateral side and a transmitting port located at the lateral side. The elastic cover is disposed at the lateral side to cover a least a portion of the transmitting port and includes a body. The body includes two shielding sheets adjacent to each other, wherein each of the shielding sheets includes a first portion close to the other shielding sheet and a second portion away from the other shielding sheet, a turn is formed between the first portion and the second portion so that a cross-section of the shielding sheet appears as a V shape, an opening of the V shape is adapted to face the lateral side of the electronic device, a slit is formed between the two shielding sheets, and the slit is adapted to be positioned corresponding to the transmitting port, wherein a transmitting object is adapted to push the two first portions of the two shielding sheets to enlarge the slit, so as to pass through the body and be plugged into the transmitting port.

In one embodiment of the invention, a ratio between a thickness of the first portion and a thickness of the second portion is in a range from ½ to ⅔.

In one embodiment of the invention, a thickness of the second portion at nearby the first portion gradually shrinks, and a ratio between a vertical distance from an inner surface of the second portion at a junction with the first portion to an outer surface of the second portion and a thickness of the first portion is in a range from 1 to 2.

In one embodiment of the invention, when the transmitting object is plugged into the transmitting port, the two first portions and the two second portions of the two shielding sheets respectively move towards four different directions.

In one embodiment of the invention, an included angle between the first portion and a horizontal plane perpendicular to the lateral side of the electronic device is greater than an included angle between the second portion and the horizontal plane.

In one embodiment of the invention, an angle difference between an included angle between the first portion and a horizontal plane perpendicular to the lateral side of the electronic device and an included angle between the second portion and the horizontal plane is greater than 35 degrees.

In one embodiment of the invention, an included angle between the first portion and a horizontal plane perpendicular to the lateral side of the electronic device is less than 60 degrees.

In one embodiment of the invention, an included angle between the second portion of the shielding sheet located at the above and a horizontal plane perpendicular to the lateral side of the electronic device is different from an included angle between the second portion of the shielding sheet of the second portion located at the below and the horizontal plane.

In one embodiment of the invention, an inner surface of the shielding sheet has a recess portion at a junction between the first portion and the second portion.

In one embodiment of the invention, a ratio between a shortest distance from an outer surface of the first portion to the recess portion and a shortest distance from an outer surface of the second portion to the recess portion is in a range from 0.5 to 1.

In view of the above, the elastic cover of the invention can be disposed beside the transmitting port of the electronic device, the cross-section of each shielding sheet of the elastic cover appears as a V shape, a slit is formed between the two shielding sheets, the slit is positioned corresponding to the transmitting port, and the two shielding sheets can cover at least a portion of the transmitting port before being deformed so that the appearance of the electronic apparatus at the lateral side is complete and aesthetic, thereby capable of lowering a chance for dust or liquid to enter into the transmitting port. When the transmitting object is to be plugged into the transmitting port of the electronic device, the transmitting object pushes the two first portions of the two shielding sheets, and the two first portions turn inwards to enlarge the slit, so that the transmitting object can pass through the body and be plugged into the transmitting port. After the transmitting object is pulled out, the two first portions are rebounded and returned to original positions.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
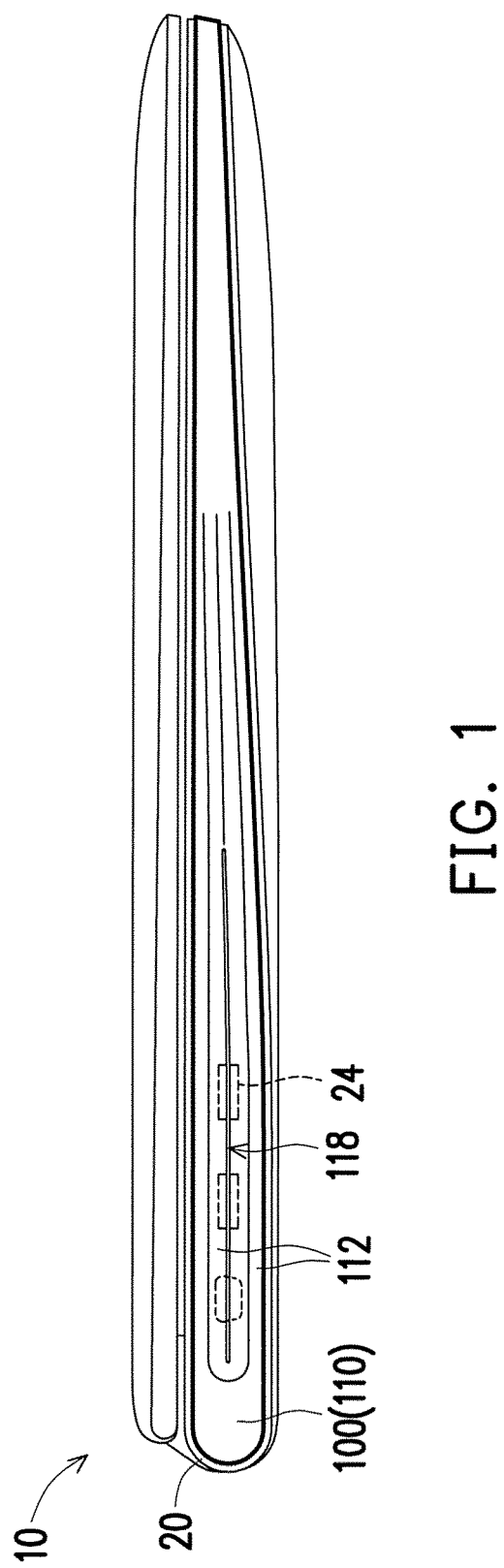
FIG. 1 is a schematic diagram illustrating a lateral side of an electronic apparatus according to an embodiment of the invention.
Figure 2:
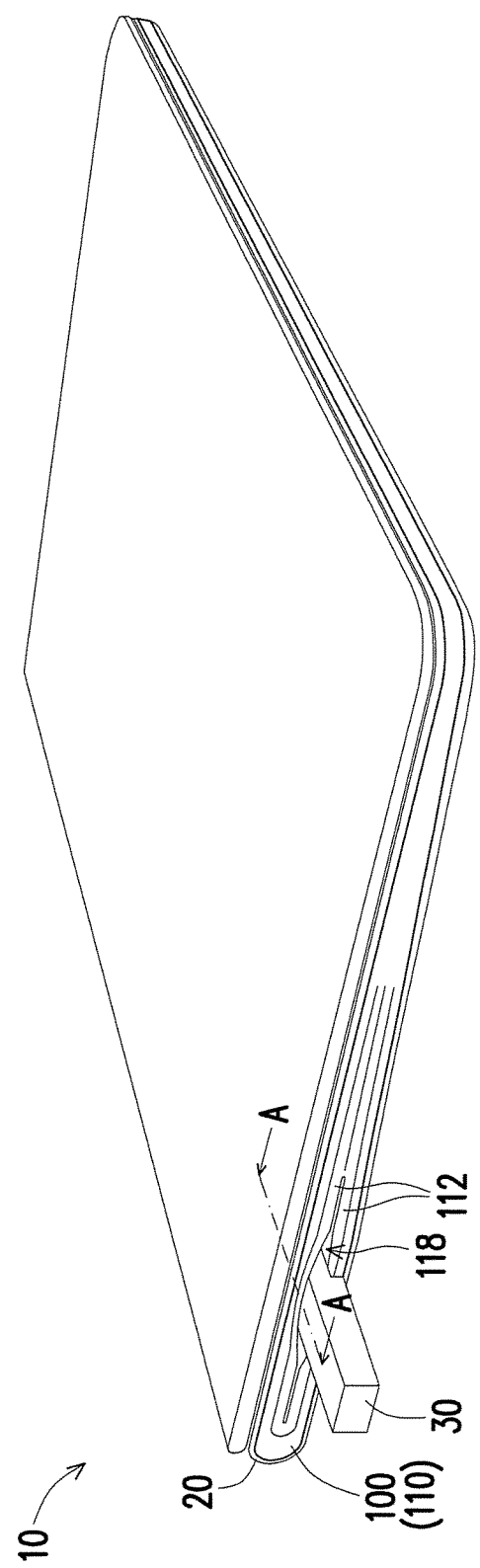
FIG. 2 is a perspective diagram illustrating a transmitting object being plugged into the electronic apparatus of FIG. 1.
Figure 3:
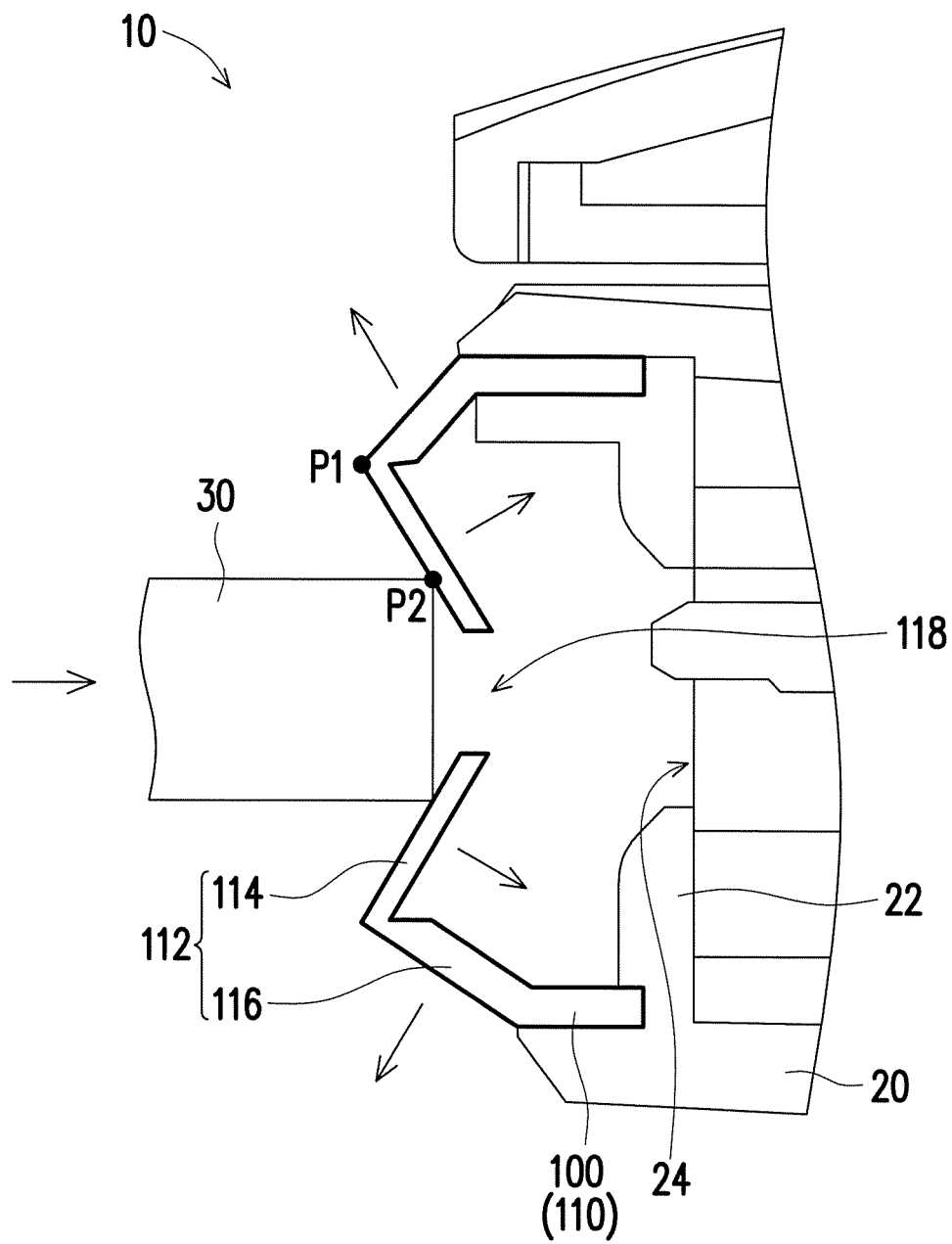
FIG. 3 is a schematic diagram illustrating a cross-section of FIG. 2 along a section line A-A.

FIG. 1 is a schematic diagram illustrating a lateral side of an electronic apparatus according to an embodiment of the invention. FIG. 2 is a perspective diagram illustrating a transmitting object being plugged into the electronic apparatus of FIG. 1. FIG. 3 is a schematic diagram illustrating a cross-section of FIG. 2 along a section line A-A. Referring to FIG. 1 through FIG. 3, an electronic apparatus 10 of the present embodiment includes an electronic device 20 and an elastic cover 100. In the present embodiment, the electronic device 20 is, for example, a notebook computer, but the type of the electronic device 20 is not limited thereto. The electronic device 20 includes a lateral side 22 and a transmitting port 24 located at the lateral side 22. The elastic cover 100 is disposed at the lateral side 22 to cover at least a portion of the transmitting port 24 and includes a body 110. A material of the body 110 can be rubber or silicone, but a material of the body 110 is not limited thereto.

As shown in FIG. 3, the body 110 includes two shielding sheets 112 disposed adjacent to each other in a manner of above and below, a slit 118 is formed between the two shielding sheets 112, and the slit 118 is adapted to be positioned corresponding to the transmitting port 24. In order to enable the shielding sheets 112 to be easily turned or folded during a process of plugging a transmitting object 30 into the transmitting port 24, in the present embodiment, each of the shielding sheets 112 includes a first portion 114 close to the other shielding sheet 112 and a second portion 116 away from the shielding sheet 112, wherein a turn is formed between the first portion 114 and the second portion 116 of each of the shielding sheets 112 so that a cross-section of each of the shielding sheets 112 appears as a V shape, and an opening of the V shape faces towards the lateral side 22 of the electronic device 20.

It can be seen from the cross-section of FIG. 3 that, in the present embodiment, there is a turning point P1 at the junction between the first portion 114 and the second portion 116 of the shielding sheet 112, and during the processing of plugging the transmitting object 30 into the transmitting port 24, the transmitting object 30 is in contact with a contact point P2 on the first portion 114 of the shielding sheet 112. Since the shielding sheet 112 appears as the V shape, the turning point P1 is located at a tip of the V shape; therefore, a distance between the contact point P2 and a plane on which the lateral side 22 of the electronic device 20 locates is smaller than a distance between the turning point P1 and the plane on which the lateral side 22 of the electronic device locates. In other words, the contact point P2 is at inside of the turning point P1 (that is, a position closer to the right of FIG. 3).

As compared to the contact point P2 being located below or outside of the turning point P1, the aforementioned configuration enables the first portion 114 to be required to turn inwards with a smaller extent during the process of plugging the transmitting object 30 into the transmitting port 24, and thus a user can apply less force to overcome a resistance from the shielding sheet 112 to the transmitting object 30. As a result, the user can easily use the transmitting object 30 to push the two first portions 114 of the two shielding sheets 112 to enlarge the slit 118, so that the transmitting object 30 can pass through the body 110 and be plugged into the transmitting port 24, as shown in FIG. 2.

In addition, the second portions 116 of the shielding sheets 112 being extended outwards (namely, to the left side of FIG. 3) can provide ends of the first portions 114 more inward space, so as to avoid the shielding sheets 112 from being blocked by the lateral side 22 of the electronic device 20 to become unable to turn inwards due to being too close to the lateral side 22 of the electronic device 20. Moreover, since the body 110 is flexible, at the same time as the transmitting object 30 is being plugged into the transmitting port 24 to enable the first portions 114 to turn inwards, the second portions 116 of the shielding sheets 112 also correspondingly move towards the outside (as shown in FIG. 3). More specifically, the second portion 116 located at the below moves towards the bottom left and the second portion 116 located at the above moves towards the upper left, so that the two shielding sheets 112 can be pushed open more easily. Therefore, as shown in FIG. 3, when the transmitting object 30 is plugged into the transmitting port 24, the two first portions 114 and the second portion 116 of the two shielding sheets 112 respectively move towards four different directions.

The elastic cover 100 of the present embodiment, as being disposed beside the transmitting port 24 of the electronic device 20, can cover at least a portion of the transmitting port 24 when the two shielding sheets 112 are not yet deformed, so that an appearance of the electronic apparatus 10 at the lateral side can be complete and aesthetic, thereby capable of lowering a chance for dust or liquid to enter into the transmitting port 24. In addition, the two shielding sheets 112 of the elastic cover 100 are disposed in a manner of above and below, the cross-section of the shielding sheet 112 appears as the V shape, and when the transmitting object 30 is to be plugged into the transmitting port 24 of the electronic device 20, the transmitting object 30 pushes the two first portions 114 of the two shielding sheets 112 so that the two first portions 114 are turned inwards to enlarge the slit 118, and the transmitting object 30 can pass through the body 110 and be plugged into the transmitting port 24. After the transmitting object 30 is pulled out, the two first portions 114 are returned to the original positions through rebound and eversion.

Moreover, in the present embodiment, in order to allow the user to smoothly plug the transmitting object 30 into the transmitting port 24, there are many corresponding designs for the shape of the shielding sheets 112, and the details are provided in below.

Figure 4:
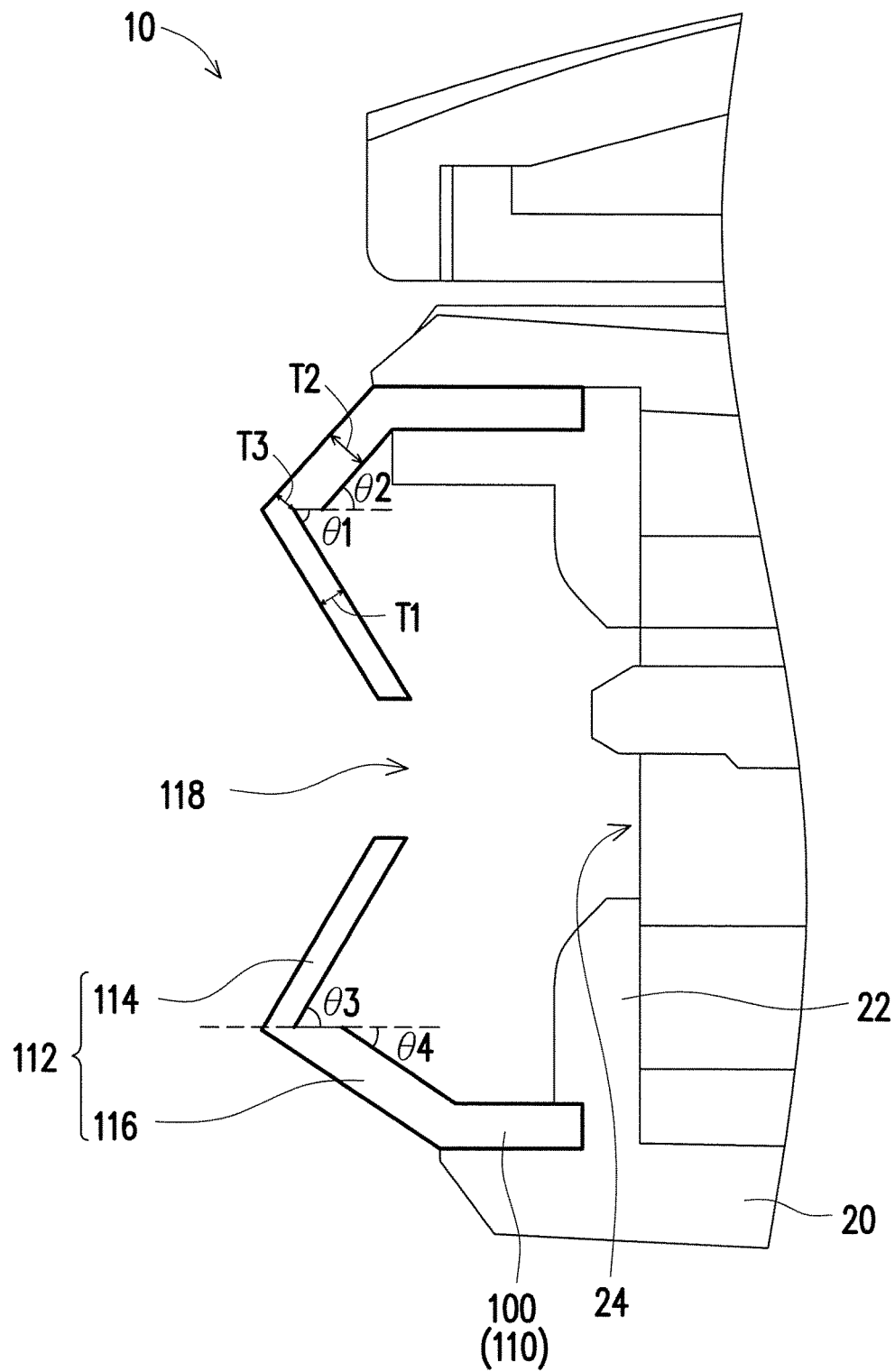
FIG. 4 is a schematic diagram illustrating a transmitting object of FIG. 3 being hidden.

FIG. 4 is a schematic diagram illustrating a transmitting object of FIG. 3 being hidden. Referring to FIG. 4, a ratio between a thickness T1 of the first portion 114 and a thickness T2 of the second portion 116 is approximately in a range from ½ to ⅔; for example, if the thickness T1 of the first portion 114 is 0.5 mm, then the thickness T2 of the second portion 116 is approximately from 0.75 mm to 1 mm. In the present embodiment, the ratio between the thickness T1 of the first portion 114 and the thickness T2 of the second portion 116 is approximately 5:8. Since the first portion 114 is thinner, when the transmitting object 30 pushes the first portion 114, the first portion 114 is more prone to be turned up, and thereby improves a smoothness of plugging the transmitting object 30. It is to be noted that, if the first portion 114 is to thin, it may be subjected to an influence of gravity and cause the shielding sheet 112 to unable to maintain the V shape, and thus the first portion 114 still need to have a certain thickness. In the present embodiment, the thickness of the first portion 114 is, for example, 0.5 mm; certainly, the thickness of the first portion 114 can be adjusted according to actual situation, and is not limited thereto.

In addition, since the elastic cover 100 is fixed to the lateral side 22 of the electronic device 20 from a part of the body 110 that is closer to the second portion 116, the second portion 116 with thicker thickness can be considered as an extension of the lateral side 22 of the electronic device 20, and a junction between the second portion 116 and the first portion 114 can be considered at a rotation fulcrum of the first portion 114. Certainly, in practical terms, during the process of plugging in the transmitting object 30, the second portion 116 may also be slightly deformed, but since the second portion 116 is thicker and the second portion 116 is not in a path of the transmitting object 30, a degree of deformation of the second portion 116 is small than that of the first portion 114.

Moreover, it can be seen from FIG. 4, the thickness of the second portion 116 at nearby the first portion 114 gradually shrinks, and a vertical distance T3 from an inner surface of the second portion 116 at the junction with the first portion 114 to an outer surface of the second portion 116 is smaller than the thickness T1 of the first portion 114, so that the first portion 114 is more easily to be turned or flipped. A ratio between the vertical distance T3 from the inner surface of the second portion 116 at the junction with the first portion 114 to the outer surface of the second portion 116 and the thickness T1 of the first portion 114 is approximately in a range from 1 to 2, for an instance; and if the vertical distance T3 from the inner surface of the second portion 116 at the junction with the first portion 114 to the outer surface of the second portion 116 is 0.3 mm, then the thickness T1 of the first portion 114 is approximately from 0.3 mm to 0.6 mm.

More specifically, in the present embodiment, ratio between the vertical distance T3 from the inner surface of the second portion 116 at the junction with the first portion 114 to the outer surface of the second portion 116 and the thickness T1 of the first portion 114 is approximately 3:5.

In addition, in the present embodiment, an included angle between the first portion 114 of each of the shielding sheets 112 and a horizontal plane perpendicular to the lateral side 22 of the electronic device 20 is greater than an included angle between the second portion 116 and the horizontal plane. In detail, when an included angle θ1 between the first portion 114 of the shielding sheet 112 located at the above and the horizontal plane is greater than an included angle θ2 between the second portion 116 of the shielding sheet 112 located at the above and the horizontal plane, then an included angle θ3 between the first portion 114 of the shielding sheet 112 located at the below and the horizontal plane is greater than an included angle θ4 between the second portion 116 of the shielding sheet 112 located at the below and the horizontal plane. In a preferred embodiment, the included angles θ1 and θ3 between the first portions 114 and a horizontal plane perpendicular to the lateral side 22 of the electronic device 20 respectively have an angle difference of greater than or equal to 35 degrees with the included angles θ2 and θ4 between the second portions 116 and the horizontal plane. Such design enables the first portions 114 to be turned inwards more easily.

Moreover, in order to prevent the included angle between the first portion 114 and the horizontal plane from being too large, thereby causing a magnitude required for turning or flipping the first portion 114 during the process of plugging in the transmitting object 30 to be too large and resulting in an actuation difficulty, in the present embodiment, the included angle between the first portion 114 and the horizontal plane is less than or not greater than 60 degrees.

Moreover, in the present embodiment, the included angle θ2 of the second portion 116 of the shielding sheet 112 located at the above and the horizontal plane is greater than the included angle θ4 of the second portion 116 of the shielding sheet 112 located at the below and the horizontal plane. Such configuration enables the transmitting object 30 to firstly contact with the first portion 114 of the shielding sheet 112 located at the below and then with the first portion 114 of the shielding sheet 112 located at the above during the process of plugging in, rather than directly contacting with both two first portions 114 at the same time, so that a resistance experienced by the transmitting object 30 at the beginning is smaller. In other embodiment, the included angle θ4 between the second portion 116 of the shielding sheet 112 located at the below and the horizontal plane can also be greater than the included angle θ2 between the second portion 116 of the shielding sheet 112 located at the above and the horizontal plane. Otherwise, in other embodiment, the included angles θ2 and θ4 respectively between the two second portions 116 of the two shielding sheets 112 and the horizontal plane may also be the same.

In the present embodiment, the included angle θ1 between the first portion 114 of the shielding sheet 112 located at the above and the horizontal plane is, for example, 60 degrees; the included angle θ2 between the second portion 116 of the shielding sheet 112 located at the above and the horizontal plane is, for example, 25 degrees; the included angle θ3 between the first portion 114 of the shielding sheet 112 located at the below and the horizontal plane is, for example, 60 degrees; and the included angle θ4 between the second portion 116 of the shielding sheet 112 located at the below an the horizontal plane is, for example, 15 degrees. Certainly, the aforementioned included angles are not limited thereto.

Moreover, referring back to FIG. 2, in the present embodiment, the body 110 of the elastic cover 100 may have a upside-down U-shape, and the body 110, in addition of being sides at two lateral sides 22 of the electronic device 20, may also be disposed beside a lateral side of the electronic device 20 that is away from a pivot shaft (not shown); such configuration in addition to providing a more consistent and aesthetic appearance, because the body 110 also has flexibility, the elastic cover 100 may also provide a protective effect against collision to the three lateral sides of the electronic device 20. Certainly, in other embodiment, the body 110 of the elastic cover 100 may also has only a single side.

Figure 5:
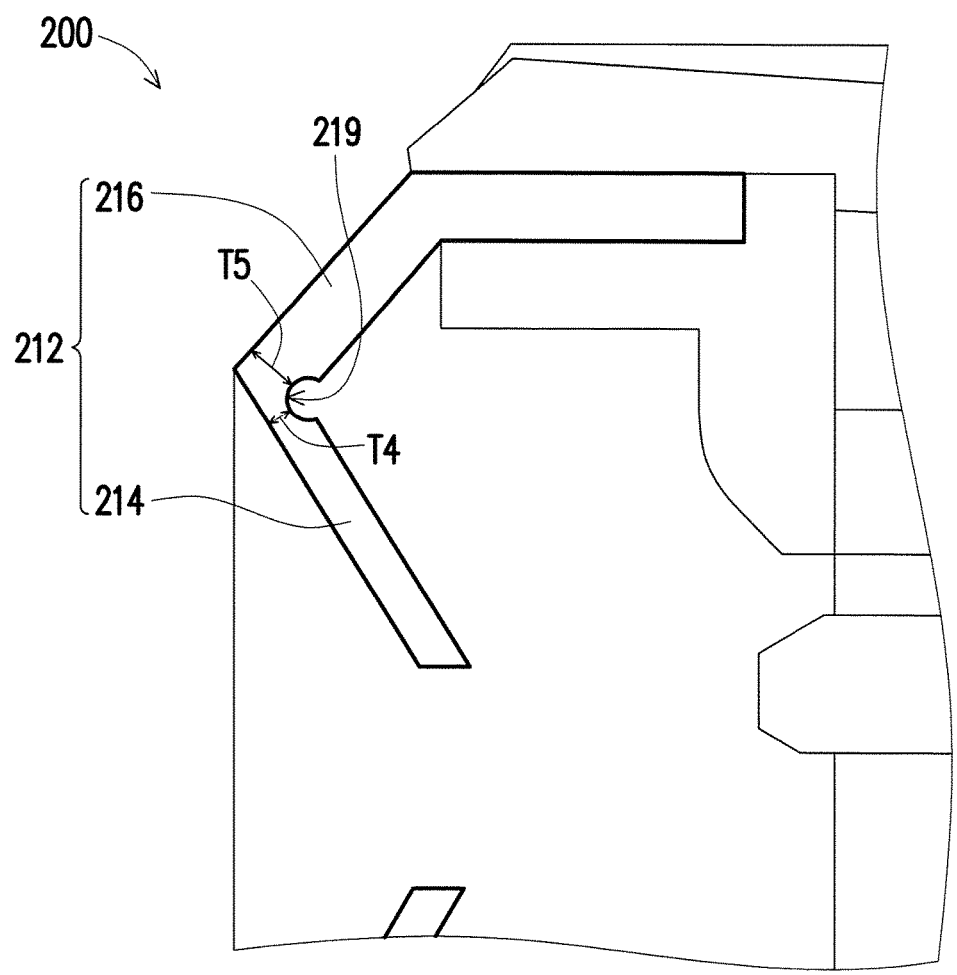
FIG. 5 is a schematic diagram illustrating a cross-section of an elastic cover according to another embodiment of the invention.

FIG. 5 is a schematic diagram illustrating a cross-section of an elastic cover according to another embodiment of the invention. Referring to FIG. 5, a main difference between an elastic cover 200 of FIG. 5 and the elastic cover 100 of FIG. 1 lies in that, in the present embodiment, an inner surface of the shielding sheet 212 has a recess portion 219 at a junction between the first portion 214 and the second portion 216. Such recess design enables the junction between the first portion 214 and the second portion 216 to be easily turned and deformed. In the present embodiment, the, recess portion 219 is, for example, arc-shaped, but the shape of the recess portion 219 is not limited thereto.

A ratio between a shortest distance T4 from an outer surface of the first portion 214 to the recess portion 219 and a shortest distance T5 from an outer surface of the second portion 216 to the recess portion 219 is approximate from 0.5 to 1, for an instance; and if the shortest distance T4 from the outer surface of the first portion 214 to the recess portion 219 is 0.3 mm, then the shortest distance T5 from the outer surface of the second portion 216 to the recess portion 219 is approximately from 0.3 mm to 0.6 mm. In the present embodiment, the ratio between the shortest distance T4 from the outer surface of the first portion 214 to the recess portion 219 and the shortest distance T5 from the outer surface of the second portion 216 to the recess portion 219 is approximately 3:5. More specifically, the shortest distance T4 from the outer surface of the first portion 214 to the recess portion 219 and the shortest distance T5 from the outer surface of the second portion 216 to the recess portion 219 are respectively 0.3 mm and 0.5 mm. Certainly, the shortest distance T4 from the outer surface of the first portion 214 to the recess portion 219 and the shortest distance T5 from the outer surface of the second portion 216 to the recess portion 219 are not limited thereto.

In addition, referring back to FIG. 1, in FIG. 1, the elastic cover 100 only has a single long slit 118 beside the lateral side 22 of the electronic device 20, and the slit 118 is corresponded to a plurality of transmitting ports 24, so that a plurality of transmitting objects 30 can be plugged into the transmitting ports 24 through the slit 118. However, the form of the slit 118 in the body 110 of the elastic cover 100 is not limited thereto.

Figure 6:
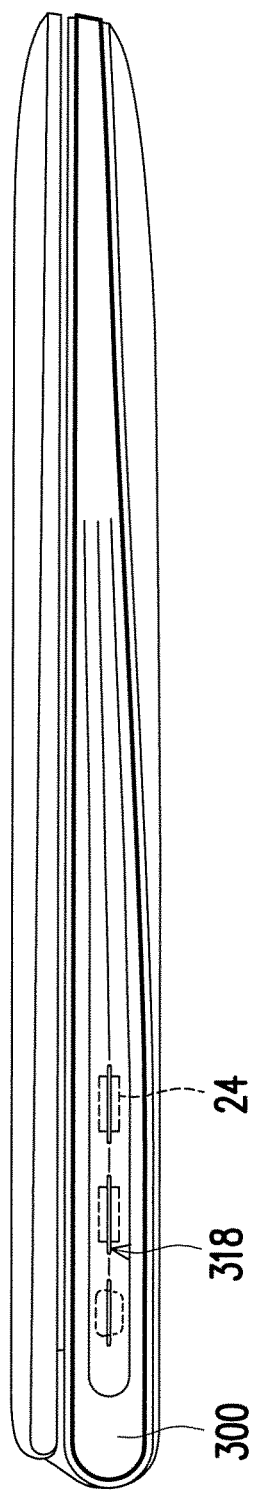
FIG. 6 and FIG. 7 are respectively a schematic diagram illustrating a lateral side an elastic cover according to other embodiments of the invention.
Figure 7:
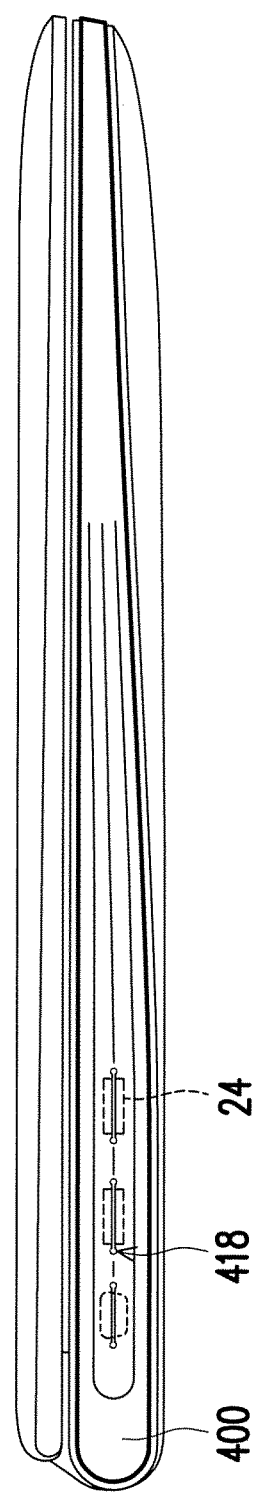

FIG. 6 and FIG. 7 are respectively a schematic diagram illustrating a lateral side an elastic cover according to other embodiments of the invention. Referring to FIG. 6 and FIG. 7, in FIG. 6, an elastic cover 300 has a plurality of slits 318, and the slits 318 are corresponded to different transmitting ports 24. In FIG. 7, slits 418 of an elastic cover 400 have different opening sizes, and in the present embodiment, the openings of the slits 418 at the two ends are larger, while the openings at the rest parts are smaller. However, in other embodiment, the openings of the slit 418 at the two ends may also be smaller, such that the forms of the slits 418 are not limited thereto.

In view of the foregoing, the elastic cover of the invention can be disposed beside the transmitting port of the electronic device, the cross-section of each shielding sheet of the elastic cover appears as a V shape, a slit is formed between the two shielding sheets, the slit is positioned corresponding to the transmitting port, and the two shielding sheets can cover at least a portion of the transmitting port before being deformed so that the appearance of the electronic apparatus at the lateral side is complete and aesthetic, thereby capable of lowering a chance for dust or liquid to enter into the transmitting port. When the transmitting object is to be plugged into the transmitting port of the electronic device, the transmitting object pushes the two first portions of the two shielding sheets, and the two first portions turn inwards to enlarge the slit, so that the transmitting object can pass through the body and be plugged into the transmitting port. After the transmitting object is pulled out, the two first portions are rebounded and returned to original positions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An elastic cover, adapted to be disposed at a lateral side of an electronic device to cover at least a portion of a transmitting port of the electronic device, the elastic cover comprising:
   a body, comprising two shielding sheets adjacent to each other, wherein each of the shielding sheet comprises a first portion close to the other shielding sheet and a second portion away from the other shielding sheet, a turn is formed between the first portion and the second portion so that a cross-section of the shielding sheet appears as a V shape, an opening of the V shape is adapted to face the lateral side of the electronic device, a slit is formed between the two shielding sheets, and the slit is adapted to be positioned corresponding to the transmitting port, wherein
   a transmitting object is adapted to push the two first portions of the two shielding sheets to enlarge the slit, so as to pass through the body and be plugged into the transmitting port.

2. The elastic cover as recited in claim 1, wherein a ratio between a thickness of the first portion and a thickness of the second portion ranges from ½ to ⅔.

3. The elastic cover as recited in claim 1, wherein a thickness of the second portion at nearby the first portion gradually shrinks, and a ratio between a vertical distance from an inner surface of the second portion at a junction with the first portion to an outer surface of the second portion and a thickness of the first portion is in a range from 1 to 2.

4. The elastic cover as recited in claim 1, wherein when the transmitting object is plugged into the transmitting port, the two first portions and the two second portions of the two shielding sheets respectively move towards four different directions.

5. The elastic cover as recited in claim 1, wherein an included angle between the first portion and a horizontal plane perpendicular to the lateral side of the electronic device is greater than an included angle between the second portion and the horizontal plane.

6. The elastic cover as recited in claim 5, wherein an angle difference between the included angle between the first portion and the horizontal plane and the included angle between the second portion and the horizontal plane is greater than 35 degrees.

7. The elastic cover as recited in claim 1, wherein an included angle between the first portion and a horizontal plane perpendicular to the lateral side of the electronic device is less than 60 degrees.

8. The elastic cover as recited in claim 1, wherein an included angle between the second portion of the shielding sheet located at the above and a horizontal plane perpendicular to the lateral side of the electronic device is different from an included angle between the second portion of the shielding sheet of the second portion located at the below and the horizontal plane.

9. The elastic cover as recited in claim 1, wherein an inner surface of the shielding sheet has a recess portion at a junction between the first portion and the second portion.

10. The elastic cover as recited in claim 9, wherein a ratio between a shortest distance from an outer surface of the first portion to the recess portion and a shortest distance from an outer surface of the second portion to the recess portion is in a range from 0.5 to 1.

11. An electronic apparatus, comprising:
an electronic device, comprising a lateral side and a transmitting port located at the lateral side;
an elastic cover, disposed at the lateral side to cover at least a portion of the transmitting port, and comprising:
a body, comprising two shielding sheets adjacent to each other, wherein each of the shielding sheet comprises a first portion close to the other shielding sheet and a second portion away from the other shielding sheet, a turn is formed between the first portion and the second portion so that a cross-section of the shielding sheet appears as a V shape, an opening of the V shape is adapted to face the lateral side of the electronic device, a slit is formed between the two shielding sheets, and the slit is adapted to be positioned corresponding to the transmitting port, wherein
a transmitting object is adapted to push the two first portions of the two shielding sheets to enlarge the slit, so as to pass through the body and be plugged into the transmitting port.

12. The electronic apparatus as recited in claim 11, wherein a ratio between a thickness of the first portion and a thickness of the second portion is in a range from ½ to ⅔.

13. The electronic apparatus as recited in claim 11, wherein a thickness of the second portion at nearby the first portion gradually shrinks, and a ratio between a vertical distance from an inner surface of the second portion at a junction with the first portion to an outer surface of the second portion and a thickness of the first portion is in a range from 1 to 2.

14. The electronic apparatus as recited in claim 11, wherein when the transmitting object is plugged into the transmitting port, the two first portions and the two second portions of the two shielding sheets respectively move towards four different directions.

15. The electronic apparatus as recited in claim 11, wherein an included angle between the first portion and a horizontal plane perpendicular to the lateral side of the electronic device is greater than an included angle between the second portion and the horizontal plane.

16. The electronic apparatus as recited in claim 15, wherein an angle difference between the included angle between the first portion and the horizontal plane and the included angle between the second portion and the horizontal plane is greater than 35 degrees.

17. The electronic apparatus as recited in claim 11, wherein an included angle between the first portion and a horizontal plane perpendicular to the lateral side of the electronic device is less than 60 degrees.

18. The electronic apparatus as recited in claim 11, wherein an included angle between the second portion of the shielding sheet located at the above and a horizontal plane perpendicular to the lateral side of the electronic device is different from an included angle between the second portion of the shielding sheet of the second portion located at the below and the horizontal plane.

19. The electronic apparatus as recited in claim 11, wherein an inner surface of the shielding sheet has a recess portion at a junction between the first portion and the second portion.

20. The electronic apparatus as recited in claim 19, wherein a ratio between a shortest distance from an outer surface of the first portion to the recess portion and a shortest distance from an outer surface of the second portion to the recess portion ranges from 0.5 to 1.

* * * * *